(12) United States Patent
Takekawa et al.

(10) Patent No.: US 6,795,516 B1
(45) Date of Patent: Sep. 21, 2004

(54) RESET CIRCUIT AND PLL FREQUENCY SYNTHESIZER

(75) Inventors: Koji Takekawa, Kasugai (JP); Koju Aoki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/523,287

(22) Filed: Mar. 10, 2000

(30) Foreign Application Priority Data

Mar. 30, 1999  (JP) ............................................ 11-088383

(51) Int. Cl.[7] .............................. H04L 7/00; H03D 3/24
(52) U.S. Cl. ........................................ 375/376; 375/354
(58) Field of Search ................................ 375/376, 354, 375/371, 373, 355, 357, 359, 362, 364, 372, 374, 375, 327; 331/14; 348/465; 365/227; 327/147, 156; 329/307, 308

(56) References Cited

U.S. PATENT DOCUMENTS

| | | | | |
|---|---|---|---|---|
| 5,337,285 A | * | 8/1994 | Ware et al. .................. | 365/227 |
| 5,548,250 A | * | 8/1996 | Fang ............................ | 331/14 |
| 5,598,219 A | * | 1/1997 | Furuya et al. ............... | 348/465 |
| 5,920,600 A | * | 7/1999 | Yamaoka et al. ........... | 375/376 |
| 6,222,420 B1 | * | 4/2001 | Gulliver et al. ............... | 331/14 |

* cited by examiner

Primary Examiner—Young T. Tse
Assistant Examiner—Sam K. Ahn
(74) Attorney, Agent, or Firm—Arent Fox PLLC (57) ABSTRACT

A reset circuit for a PLL frequency synthesizer allows the PLL to quickly generate an output signal after waking up from a power-save mode. The reset circuit includes a delay circuit for receiving a shift signal and generating the output signal by delaying the shift signal for a predetermined time. A determination signal receives the shift signal and the output signal, determines whether they match, and generates a reset signal from the predetermined time when the shift signal is being shifted. A control circuit receives a power-save signal, which deactivates the PLL, and provides the delay circuit with a control signal for matching the output signal with the shift signal when the power-save signal is cancelled.

8 Claims, 8 Drawing Sheets

RESET CIRCUIT AND PLL FREQUENCY SYNTHESIZER

BACKGROUND OF THE INVENTION

The present invention relates to a PLL frequency synthesizer which matches the frequency of an output signal with a set frequency, and an optimal reset circuit for the PLL frequency synthesizer.

In recent years, PLL frequency synthesizers have been employed in mobile communication devices, such as cellular phones. A mobile communication device uses two frequency bands. The interval between each frequency is large. Thus, a voltage-controlled oscillator (VCO), which forms a PLL synthesizer, cannot handle frequency fluctuations. Accordingly, the PLL synthesizer is provided with a reset circuit for temporarily stopping the operation until the VCO stabilizes. Further, the PLL frequency synthesizer has a power-save function to reduce power consumption so that the battery of the mobile communication device lasts longer. The PLL frequency synthesizer provided with such functions must also be capable of immediately switching the frequency of an output signal to a desired one to improve performance of the mobile communication device.

Figure 6:
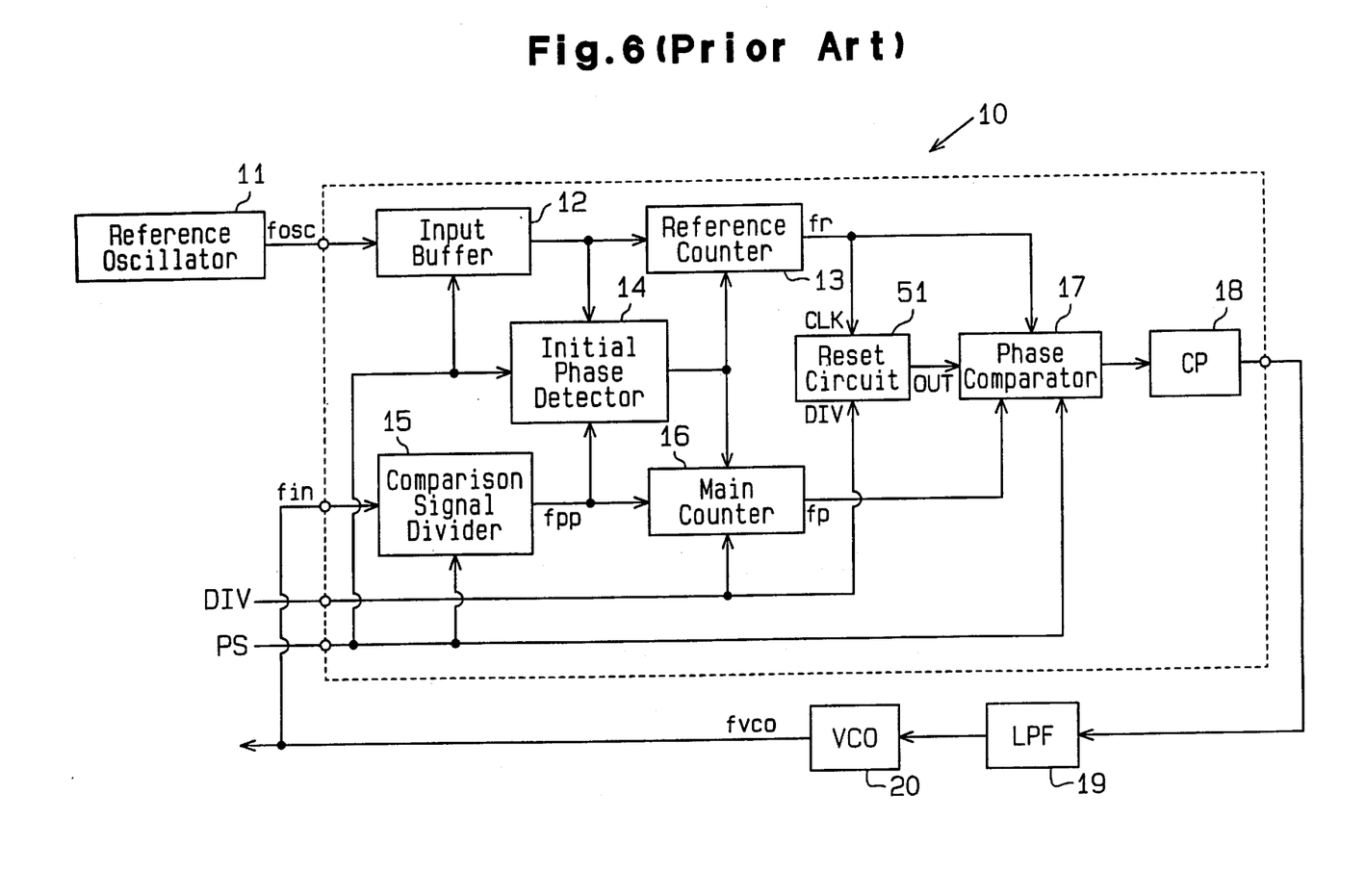
FIG. 6 is a block diagram showing a prior art PLL frequency synthesizer.

FIG. 6 is a schematic block diagram showing a prior art PLL frequency synthesizer 10 including a reset circuit and provided with a power-save function.

A reference oscillator 11 provides a reference oscillation signal fosc to a reference counter 13 and an initial phase detector 14 via an input buffer 12. A comparison oscillation signal fin is divided by a comparison signal divider 15 and provided to a main counter 16 and the initial phase detector 14. The reference counter 13 divides the reference oscillation signal fosc based on a predetermined reference dividing ratio and provides a resulting divided signal, i.e., reference signal fr, to a phase comparator 17. The comparison signal divider 15 divides the comparison oscillation signal fin based on a predetermined dividing ratio and provides a resulting divided signal fpp to the main counter 16. The main counter 16 divides the divided signal fpp based on a predetermined comparison dividing ratio and provides a resulting divided signal, i.e., comparison signal fp, to the phase comparator 17.

The initial phase detector 14 receives the reference oscillation signal fosc and the divided signal fpp. If the reference oscillation signal fosc goes high during a predetermined period from when the divided signal fpp goes high, the initial phase detector 14 sends a command signal to the reference counter 13 and the main counter 16 to enable operation of the counters 13, 16. On the other hand, if the reference oscillation signal fosc remains low during the predetermined period from when the divided signal fpp goes high, the initial phase detector 14 provides the reference counter 13 and the main counter 16 with a command signal that inhibits operation of the counters 13, 16.

The phase comparator 17 receives the reference signal fr and the comparison signal fp to compare the rising edge of the reference signal fr with that of the comparison signal fp. The phase comparator 17 provides a pulse signal, which corresponds to the frequency difference and phase difference of the signals fr, fp, to a charge pump 18. A pull-up transistor or pull-down transistor of the charge pump 18 is activated based on the pulse signal from the phase comparator 17. A low-pass filter 19 connected to the charge pump 18 functions as a load applied to the charge pump 18. In the charge pump 18, activation of the pull-up transistor increases the output voltage, and activation of the pull-down transistor decreases the output voltage.

The low-pass filter 19 smoothes the output voltage of the charge pump 18 and sends the smoothed output voltage to a voltage control oscillator (VCO) 20. The VCO 20 generates a frequency output signal fvco corresponding to the output voltage of the low-pass filter 19. The output signal fvco is used as a transmission wave of the communication device. Further, the output signal fvco is provided to the comparison signal divider 15 as the comparison oscillation signal fin.

The PLL frequency synthesizer 10 locks the output signal fvco, which is used as a transmission wave, to a frequency corresponding to the reference dividing ratio of the reference counter 13 and the comparison dividing ratio of the main counter 16.

Figure 7:
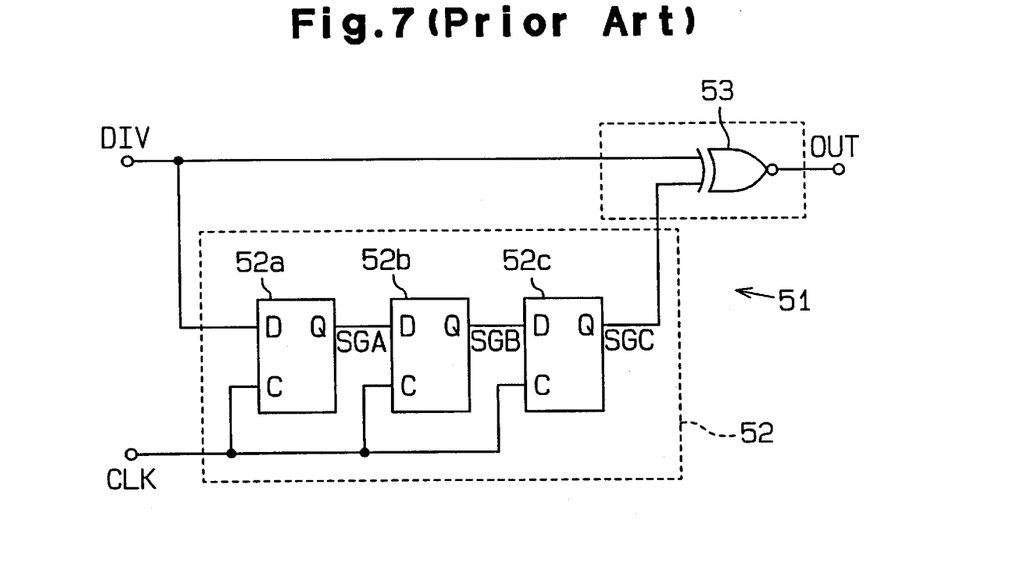
FIG. 7 is a block diagram showing a reset circuit employed in the PLL frequency synthesizer of FIG. 6.

The PLL frequency synthesizer 10 also includes a reset circuit 51. The reset circuit 51 receives the reference signal fr from the reference counter 13, as a delayed clock CLK, and a frequency setting signal DIV. FIG. 7 is a block diagram showing the reset circuit 51.

The reset circuit 51 includes a delay circuit 52 and an exclusive NOR circuit 53. The delay circuit 52 has three D flip-flops (DFFs) 52a–52c. Each of the DFFs 52a–52c has a clock input terminal C, which receives the delayed clock CLK (reference signal fr) shown in FIG. 6. The first DFF 52a has a data input terminal D for receiving the frequency setting signal DIV and an output terminal Q connected to a data input terminal D of the second DFF 52b. The second DFF 52b has an output terminal Q connected to a data input terminal D of the third DFF 52c.

The frequency setting signal DIV, which is provided by an external device, is a signal inverted between a high level and a low level each time the frequency of the output signal fvco generated by the PLL frequency synthesizer 10 changes.

Figure 8:
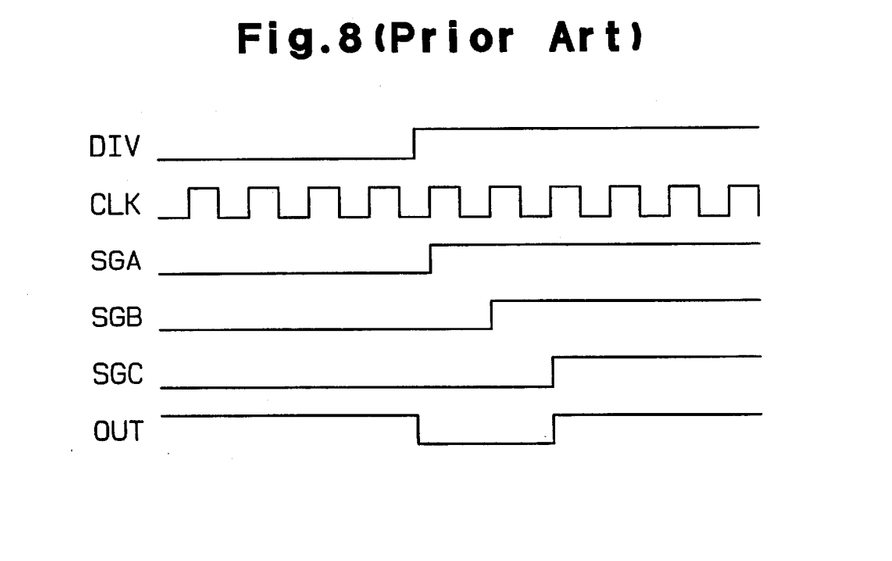
FIG. 8 is a timing chart showing the behavior of signals in the reset circuit of FIG. 7.

More specifically, with reference to FIG. 8, subsequent to the rising of the frequency setting signal DIV and in response to a first pulse of the delayed clock CLK, the first DFF 52a holds the frequency setting signal DIV at the high level and outputs the frequency setting signal DIV (output signal SGA) from the output terminal Q. Then, when a second pulse of the delayed clock CLK is output, the second DFF 52b holds the output signal SGA, which is held and output by the first DFF 52a, at the high level and outputs the output signal SGA (output signal SGB) from the output terminal Q. Afterward, when a third pulse of the delayed clock CLK is output, the third DFF 52a holds the output signal SGB, which is held and output by the second DFF 52b, and outputs the output signal SGB (output signal SGC) from the output terminal Q.

Accordingly, the delay circuit 52, which includes the DFFs 52a–52c, acts as a shift register. If the level of the input frequency setting signal DIV shifts, the shift register shifts the level of the output frequency setting signal DIV (output signal SGC) when receiving three pulses of the delayed clock CLK subsequent to the level shift of the input frequency setting signal DIV.

The exclusive NOR circuit 53 receives the output signal SGC from the delay circuit 52 and the frequency setting signal DIV. If the level of the output signal SGC matches that of the frequency setting signal DIV, the exclusive NOR circuit 53 causes a reset signal, i.e., output signal OUT, to go high. If the level of the output signal SGC does not match that of the frequency setting signal DIV, the exclusive NOR circuit 53 causes the reset signal, i.e., output signal OUT, to go low. Therefore, when the level of the frequency setting signal DIV changes, the output signal OUT of the exclusive NOR circuit 53 is low from when the level changes to when three pulses of the delayed clock CLK are received.

The output signal OUT of the reset circuit 51 is provided to an internal circuit, i.e., the phase comparator 17. The phase comparator 17 is activated when the output signal OUT is high and deactivated when the output signal OUT is low. Thus, the phase comparator 17 stops operation (initialization) whenever the frequency setting signal DIV changes until three pulses of the delayed clock CLK have been received. That is, during the period from when the set frequency changes to when the VCO 20 stabilizes in response to the change, the reset circuit 51 temporarily stops operation (initialization) of the phase comparator 17 and deactivates the PLL frequency synthesizer 10.

Further, the PLL frequency synthesizer 10 receives a power-save signal PS, which is provided to the input buffer 12, the initial phase detector 14, the comparison signal divider 15, and the phase comparator 17. The power-save signal PS, which is provided by an external device, activates the PLL frequency synthesizer 10 when high and deactivates the PLL frequency synthesizer 10 when low.

The input buffer 12, the initial phase detector 14, the comparison signal divider 15, the main counter 16, and the phase comparator 17 are also deactivated when the power-save signal PS is low. In other words, when not in use, the PLL frequency synthesizer 10 is deactivated to reduce battery power consumption.

However, if the level of the frequency setting signal DIV shifts when in a power-save mode (the period during which the power-save signal PS is low), the PLL frequency synthesizer 10, which includes the reset circuit 51 experiences a problem, as described below.

Figure 9:
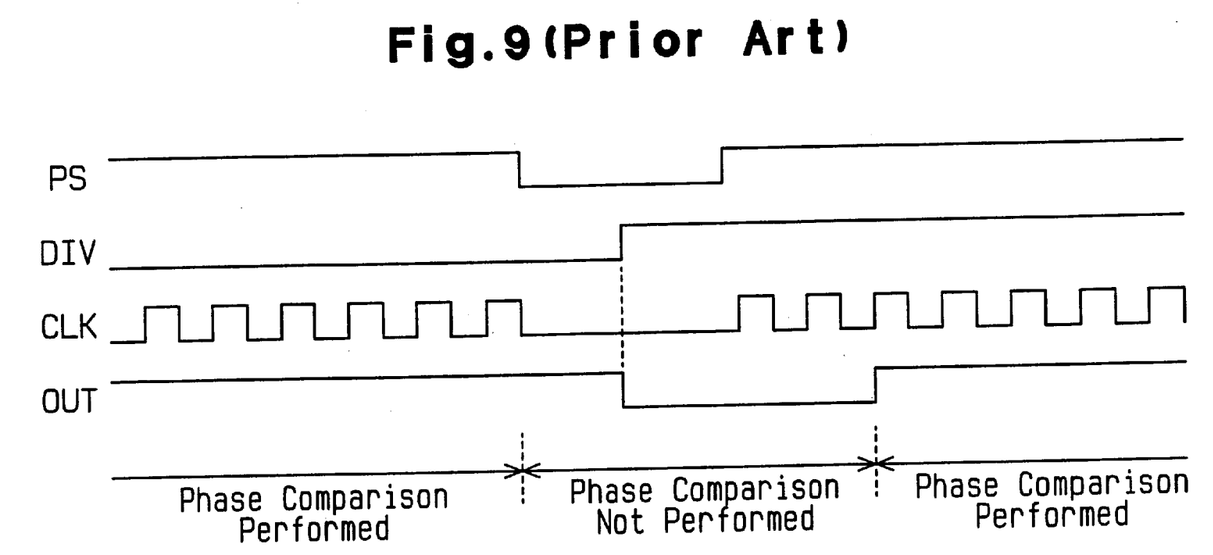
FIG. 9 is a timing chart showing the behavior of signals in the reset circuit of FIG. 7 when the power-save signal is shifted.

FIG. 9 is a timing chart showing various signals when the power-save signal PS is shifted.

During the power-save mode (when the power-save signal PS is low), a shift in the level of the frequency setting signal DIV causes the output signal OUT of the reset circuit 51 to go low, which deactivates the phase comparator 17.

The PLL frequency synthesizer 10 is activated when the power-save mode is cancelled (when the power-save signal PS goes high). When the first DFF 52a of the reset circuit 51 receives the first pulse of the delayed clock CLK (reference signal fr) subsequent to cancellation of the power-save mode, the second and third DFFs 52b, 52c hold and do not shift the level of the frequency setting signal DIV. Thus, the output signal OUT of the reset circuit 51 remains low until the third DFF 52c holds the shifted frequency setting signal DIV. In other words, the activation of the PLL frequency synthesizer 10 is delayed. This delays the lockup operation performed by the PLL frequency synthesizer 10.

SUMMARY OF THE INVENTION

It is an object of the present invention to provide a PLL frequency synthesizer and a reset circuit that prevent a delayed lock-up operation even if the frequency setting signal is shifted during the power-save mode.

To achieve the above object, the present invention provides a reset circuit including a delay circuit for receiving a shift signal and generating an output signal by delaying the shift signal for a predetermined time. A determination circuit receives the shift signal and the output signal, determines whether the level of the shift signal matches the level of the output signal, and generates a non-matching signal for the predetermined time when the level of the shift signal is being shifted. The non-matching signal is provided as a reset signal to an internal circuit for the predetermined time. A control circuit receives a power-save signal, which deactivates the internal circuit. The control circuit provides the delay circuit with a control signal for matching the level of the output signal with the level of the shift signal when the power-save signal is cancelled.

Another aspect of the present invention provides a reset circuit for a PLL frequency synthesizer. The synthesizer includes a phase comparator that stops comparing the phase of a reference signal with the phase of a comparison signal for a predetermined time whenever the level of a frequency setting signal is shifted. The reset circuit includes a delay circuit for receiving the frequency setting signal and generating an output signal by delaying the frequency setting signal for a predetermined time. A determination circuit receives the frequency setting signal and the output signal, determines whether the level of the frequency setting signal matches a level of the output signal, and generates a reset signal for the predetermined time when the level of the frequency setting signal is shifted. The reset signal is provided to the phase comparator for the predetermined time. A control circuit receives a power-save signal and deactivates the phase comparator in response thereto. The control circuit provides the delay circuit with a control signal for matching the level of the output signal with the level of the frequency setting signal when the power-save signal is cancelled.

A further aspect of the present invention provides a reset circuit for a PLL frequency synthesizer. The synthesizer includes a phase comparator that stops comparing the phase of a reference signal with the phase of a comparison signal for a predetermined time whenever the level of a frequency setting signal is shifted. The reset circuit includes a delay circuit for receiving the frequency setting signal and generating a plurality of output signals, each having a different delay time, based on the frequency setting signal. A time adjustment circuit selects and outputs one of the plurality of output signals. A determination circuit receives the frequency setting signal and the output signal selected by the time adjustment circuit, determines whether the level of the frequency setting signal matches the level of the selected output signal, and generates a reset signal for the predetermined time when the level of the frequency setting signal is shifted. The reset signal is provided to the phase comparator for the predetermined time. A control circuit receives a power-save signal, which deactivates the phase comparator. The control circuit provides the delay circuit with a control signal for matching the level of the selected output signal with the level of the frequency setting signal when the power-save signal is cancelled.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment according to a first embodiment of the present invention will now be described with reference to FIGS. 1 to 3. In the drawings, like numerals are used for like elements throughout and elements that are identical to those employed in the prior art PLL frequency synthesizer 10 of FIG. 6 will not be further described for the sake of brevity.

Figure 1:
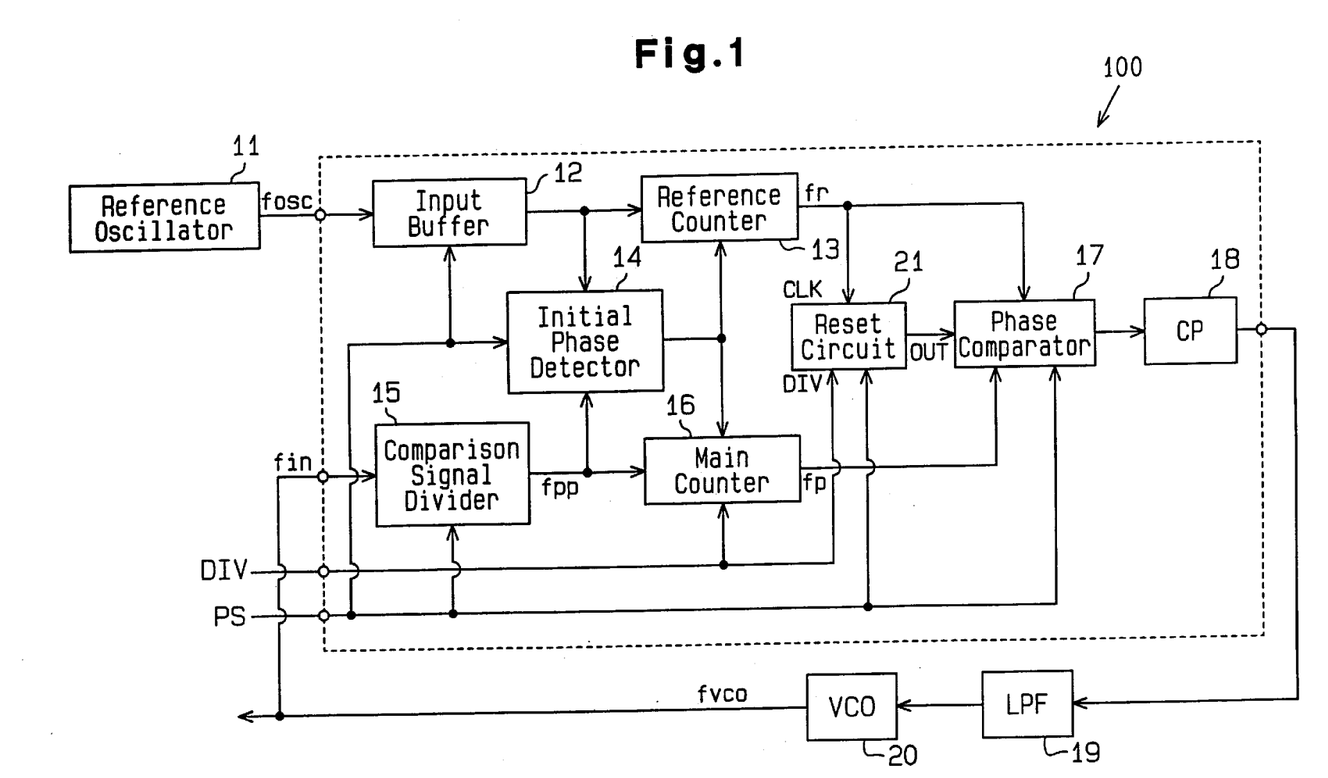
FIG. 1 is a block diagram showing a PLL frequency synthesizer according to a first embodiment of the present invention.
Figure 2:
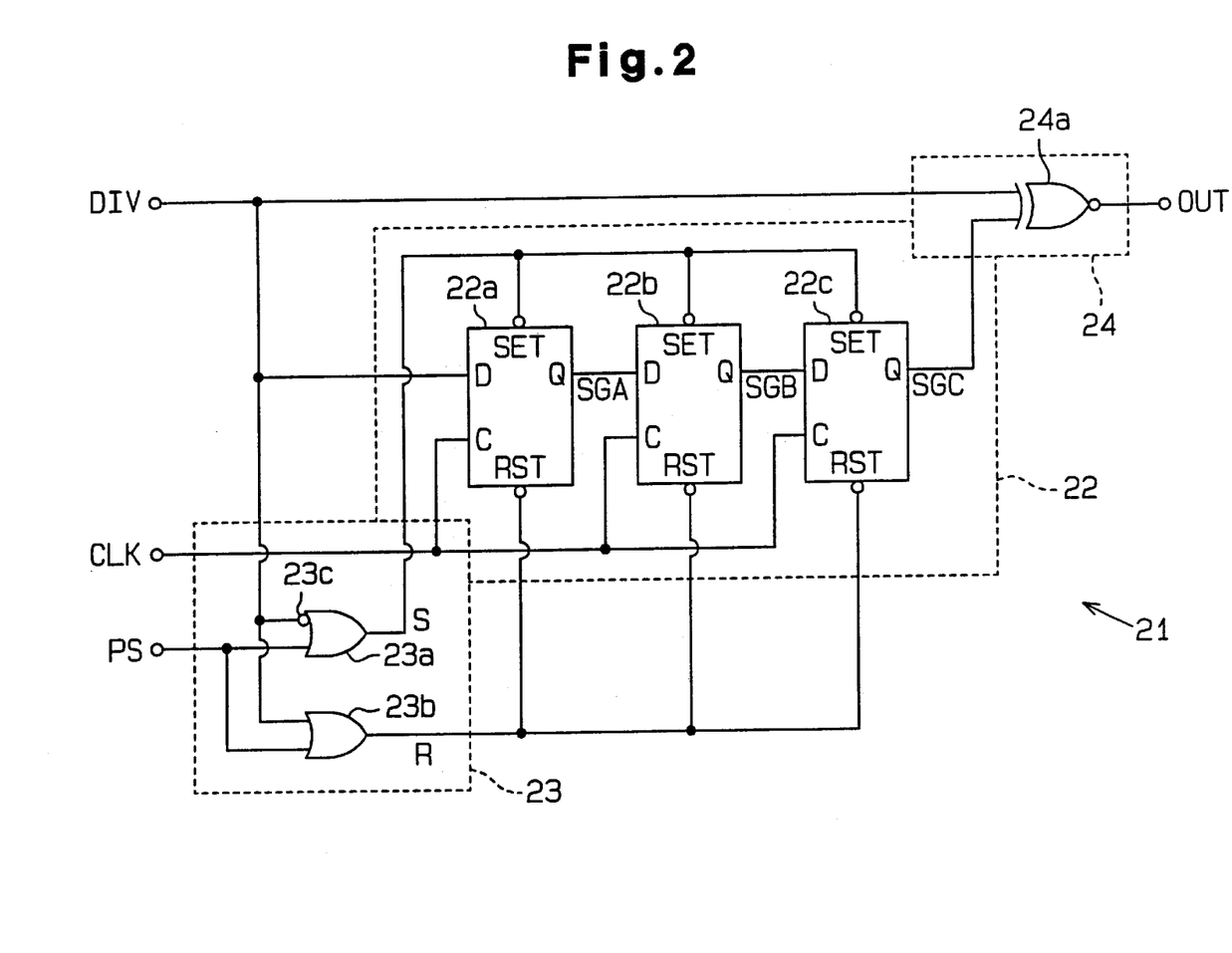
FIG. 2 is a block diagram showing a reset circuit employed in the PLL frequency synthesizer of FIG. 1.
Figure 3:
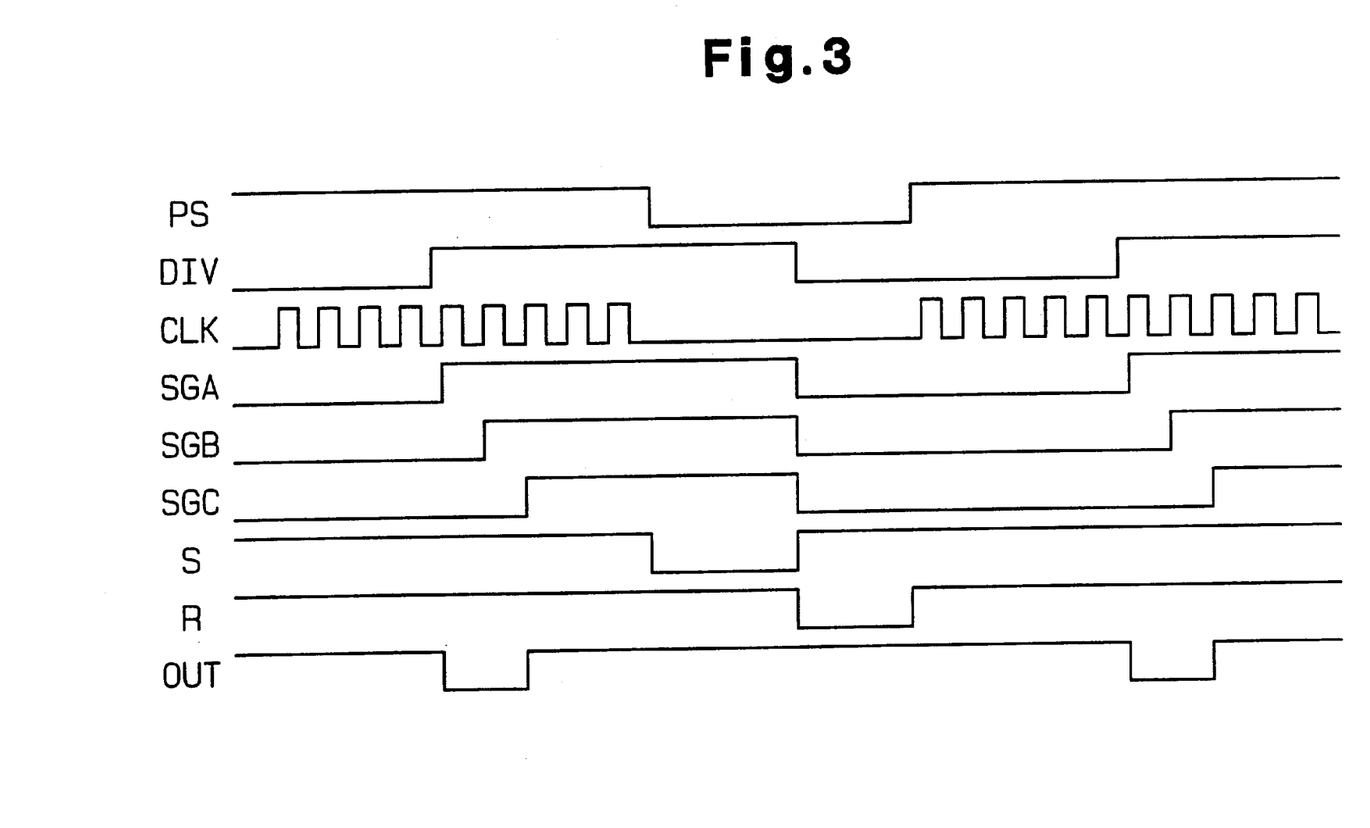
FIG. 3 is a timing chart showing the behavior of signals in the reset circuit of FIG. 2.

FIG. 1 is schematic block diagram showing a PLL frequency synthesizer 100, and FIG. 2 is a schematic block diagram showing a reset circuit 21 provided in the PLL frequency synthesizer 100 of FIG. 1.

With reference to FIG. 1, the reset circuit 21 receives the reference signal fr as the delayed clock CLK from the reference counter 13. The reset circuit 21 also receives the frequency setting signal DIV and the power-save signal PS.

Referring to FIG. 2, the reset circuit 21 includes a delay circuit 22, a control circuit 23, and a determination circuit 24. The delay circuit 22 comprises three D flip-flops (SR-DFFs) 22a, 22b, 22c, each of which has a set input terminal SET and a rest input terminal RST. The SR-DFFs 22a–22c each have a clock input terminal C, which receives the delayed clock CLK (reference signal fr). The first SR-DFF 22a has a data input terminal D, which receives the frequency setting signal DIV, and an output terminal Q, which is connected to a data input terminal D of the second SR-DFF 22b. The second SR-DFF 22b has an output terminal Q connected to a data input terminal D of the third SR-DFF 22c.

Accordingly, the delay circuit 22, which includes the SR-DFFs 22a–22c, forms a shift register. The shift register shifts the level of the output frequency setting signal DIV (output signal SGC) when receiving a third pulse of the delayed clock CLK. That is, the delay circuit 22 delays the frequency setting signal DIV for a predetermined time (until three pulses of the clock CLK are input) before generating the output signal SGC.

The control circuit 23 includes a first OR circuit 23a, a second OR circuit 23b, and an inverter circuit 23c. The first OR circuit 23a receives the frequency setting signal DIV via the inverter circuit 23c and the power-save PS signal PS. The output signal, i.e., control signal, generated by the first OR circuit 23a is provided to the SET input terminal of each SR-DFF 22a–22c as a set signal S. Accordingly, the SR-DFFs 22a–22c are set in response to the set signal S thereby causing the associated output signals SGA-SGC to go high.

The second OR circuit 23b receives the frequency setting signal DIV and the power-save signal PS. The output signal, i.e., control signal, generated by the second OR circuit 23b is provided to the reset input terminal RST of each SR-DFF 22a–22c as a reset signal R. Accordingly, the SR-DFFs 22a–22c are each reset in response to the reset signal R thereby causing the associated output signals SGA-SGC to go low.

The determination circuit 24 includes an exclusive NOR circuit 24a, which receives the output signal SGC from the delay circuit 22 and the frequency setting signal DIV. The output signal OUT, which acts as a reset signal in the PLL frequency synthesizer 100, generated by the exclusive NOR circuit 24a goes high when the level of the output signal SGC matches that of the frequency setting signal DIV. If the level of the output signal SGC differs from that of the frequency setting signal DIV, the output signal OUT goes low. Accordingly, when the input frequency setting signal DIV is shifted, the exclusive NOR circuit 24a maintains the output signal OUT low until receiving three pulses of the delayed clock CLK (the period of which is hereafter referred to as a non-reset period).

The output signal OUT is provided to the phase comparator 17. The phase comparator 17 is activated when the output signal OUT is high and deactivated when the output signal OUT is low.

The operation of the PLL frequency synthesizer under different circumstances will now be described.

(1) Non-power-save Mode

The power-save signal PS, the set signal S, and the reset signal R are all high when the power-save mode is not active or cancelled.

When the frequency setting signal DIV is shifted, the exclusive NOR circuit 24a causes the output signal OUT, which is provided to the phase comparator 17, to go low during the non-reset period. Accordingly, the phase comparator 17 does not operate until the non-reset period has elapsed beginning from when the level of the frequency setting signal DIV is shifted.

Therefore, the PLL frequency synthesizer 100 is deactivated when the level of the frequency setting signal DIV is being shifted until the operation of the VCO 20 stabilizes.

(2) Entering Power-save Mode from Non-power Save Mode

The power-save signal PS shifts from a high level to a low level when entering the power-save mode.

The input buffer 12, the initial phase detector 14, the comparison signal divider 15, and the phase comparator 17 are deactivated when the power-save signal PS goes low. This deactivates the PLL frequency synthesizer 100.

Deactivation of the input buffer 12 stops the output of the delayed clock CLK (reference signal fr) from the reference counter 13. Each of the SR-DFFs 22a–22c are deactivated until the delayed clock CLK (reference signal fr) is output. The output signals SGA-SGC of the respective SR-DFFs 22a–22c thus remain at the same level.

Further, when the power-save signal PS goes low, one of the set signal S and the reset signal R, which are output from the control circuit 23, goes low. That is, either the set signal S or the reset signal R goes low depending on the level of the present frequency setting signal DIV. More specifically, the set signal S goes low when the frequency setting signal DIV is high, and the reset signal R goes low when the frequency setting signal DIV is low.

The output signal SGC of the delay circuit 22 goes high when the set signal S is low. The output signal SGC goes low when the reset signal R is low.

(3) Cancellation of Power-save Mode, First State

Cancellation of the power-save mode when the frequency setting signal DIV is not shifted at all during the power-save mode will be discussed next.

The input buffer 12, the initial phase detector 14, the comparison signal divider 15, and the phase comparator 17 are reactivated when the power-save signal PS goes high.

When the power-save signal PS goes high, the control circuit 23 causes both of the set signal S and the reset signal R to go high regardless of the level of the frequency setting signal DIV.

If the set signal S is low when the frequency setting signal DIV is high, the SR-DFFs 22a–22c of the delay circuit 22 are set and the associated output signals SGA-SGC are high. Accordingly, the output signal OUT of the exclusive NOR circuit 24a goes high. This immediately activates the phase comparator 17.

On the other hand, if the reset signal R is low when the frequency setting signal DIV is low, the SR-DFFs 22a–22c of the delay circuit 22 are each reset and the associated output signals SGA-SGC are low. Accordingly, the output signal OUT of the exclusive NOR circuit 24a goes high. This immediately activates the phase comparator 17.

(4) Cancellation of Power-save Mode, Second State

Cancellation of the power-save mode when the frequency setting signal DIV is shifted one or more times during the power-save mode will be discussed next.

Second state, first case

A first case in which the frequency setting signal DIV goes low before the power-save signal PS goes high will be discussed. When the frequency setting signal DIV is high and the power-save signal PS is still low, the set signal S is low and the reset signal R is held at a high level.

As the frequency setting signal DIV goes low, the control circuit 23 causes the set signal S to go high and the reset signal R to go low. When the reset signal R is low, the output signals SGA-SGB of the respective SR-DFFs 22a–22c each go low. This causes the output signal OUT of the exclusive NOR circuit 24a to go high. The high output signal OUT is provided to the phase comparator 17. However, the phase comparator 17 remains deactivated since the power-save signal PS is low.

The input buffer 12, the initial phase detector 14, the comparison signal divider 15, and the phase comparator 17 are activated when the power-save signal PS goes high.

If the power-save signal PS goes high when the frequency setting signal DIV is low, the control circuit 23 causes the reset signal R to go high. When the reset signal R is low, the output signals SGA-SGB of the respective SR-DFFs 22a–22c each go low. This causes the output signal OUT of the exclusive NOR circuit 24a to go high.

As a result, the phase comparator 17 is immediately activated by the high power-save signal PS and the high output signal OUT.

If the frequency setting signal DIV goes high again before the power-save signal PS goes high, the set signal S goes low and the reset signal R goes high. In response to the low set signal S, the output signals SGA-SGC of the respective SR-DFFs 22a–22c each go high. Thus, the output signal OUT of the exclusive NOR circuit 24a goes high.

The control circuit 23 causes the set signal S to go high if the power-save signal PS goes high. When the set signal S is low, the output signals SGA-SGB of the respective SR-DFFs 22a–22c each go high, and the output signal OUT of the exclusive NOR circuit 24a goes high (DIV is high). As a result, the phase comparator 17 is immediately activated by the high power-save signal PS and the high output signal OUT.

Second state, second case

A second case in which the frequency setting signal DIV goes high before the power-save signal PS goes high will be discussed. When the power-save signal PS is still low, the set signal S is low and the reset signal R is held at a high level.

If the power-save signal PS is still low and the frequency setting signal DIV goes low, then the reset signal R goes low and the set signal S goes high.

Then, as the frequency setting signal DIV goes high, the control circuit 23 causes the reset signal R to go high and the set signal S to go low.

When the set signal S is low, the output signals SGA-SGB of the respective SR-DFFs 22a–22c each go high. This causes the output signal OUT of the exclusive NOR circuit 24a to go high. The high output signal OUT is provided to the phase comparator 17. However, the phase comparator 17 remains deactivated since the power-save signal PS is low.

The input buffer 12, the initial phase detector 14, the comparison signal divider 15, and the phase comparator 17 are activated as the power-save signal PS goes high.

Since the power-save signal PS goes high when the frequency setting signal DIV is high, the control circuit 23 causes the set signal S to go high. When the set signal S is low, the output signals SGA-SGB of the respective SR-DFFs 22a–22c each go high. This causes the output signal OUT of the exclusive NOR circuit 24a to go high.

As a result, the phase comparator 17 is immediately activated by the high power-save signal PS and the high output signal OUT.

If the frequency setting signal DIV goes low again before the power-save signal PS goes high, the reset signal R goes low and the set signal S goes high. In response to the low reset signal R, the output signals SGA-SGC of the respective SR-DFFs 22a–22c each go low. Thus, the output signal OUT of the exclusive NOR circuit 24a goes high.

The control circuit 23 causes the reset signal R to go high if the power-save signal PS goes high. When the reset signal R is low, the output signals SGA-SGB of the respective SR-DFFs 22a–22c each go low, and the output signal OUT of the exclusive NOR circuit 24a goes high. As a result, the phase comparator 17 is immediately activated by the high power-save signal PS and the high output signal OUT.

The advantages of the first embodiment will now be described.

(1) When the power-save mode is turned off or cancelled, the power-save signal PS goes high, the delay circuit 22 sets or resets the level of the output signal SGC with that of the current frequency setting signal DIV in accordance with the set signal S or the reset signal R generated by the control circuit 23. Accordingly, the frequency setting signal DIV and the output signal SGC, which are provided to the exclusive NOR circuit 24a, have the same levels. Thus, the output signal OUT, which is provided to the phase comparator 17 from the exclusive NOR circuit 24a, does not go low.

Consequently, when the power-save mode is cancelled, the phase comparator 17 immediately compares the reference signal fr with the comparison signal fp without stopping the comparison process for the predetermined time determined by the reset circuit 21. Thus, in the PLL frequency synthesizer of the first embodiment, the lock-up process is performed without being delayed by the reset circuit 21 after the power-save mode is cancelled regardless of whether the frequency setting signal DIV is shifted or not during the power-save mode.

(2) The control circuit 23 of the reset circuit 21 is formed by the two OR circuits 23a, 23b and the inverter circuit 23c. Accordingly, the circuit scale of the reset circuit 21 is not unnecessarily enlarged, and an increase in the circuit scale of the PLL frequency synthesizer is avoided.

A second embodiment according to the present invention will now be described with reference to FIG. 4. Description will be centered on the delay circuit and the control circuit, which include the novel features of the second embodiment. In the drawings illustrating the first and second embodiments, like numerals are used for like elements throughout. These like elements will not be described below.

Figure 4:
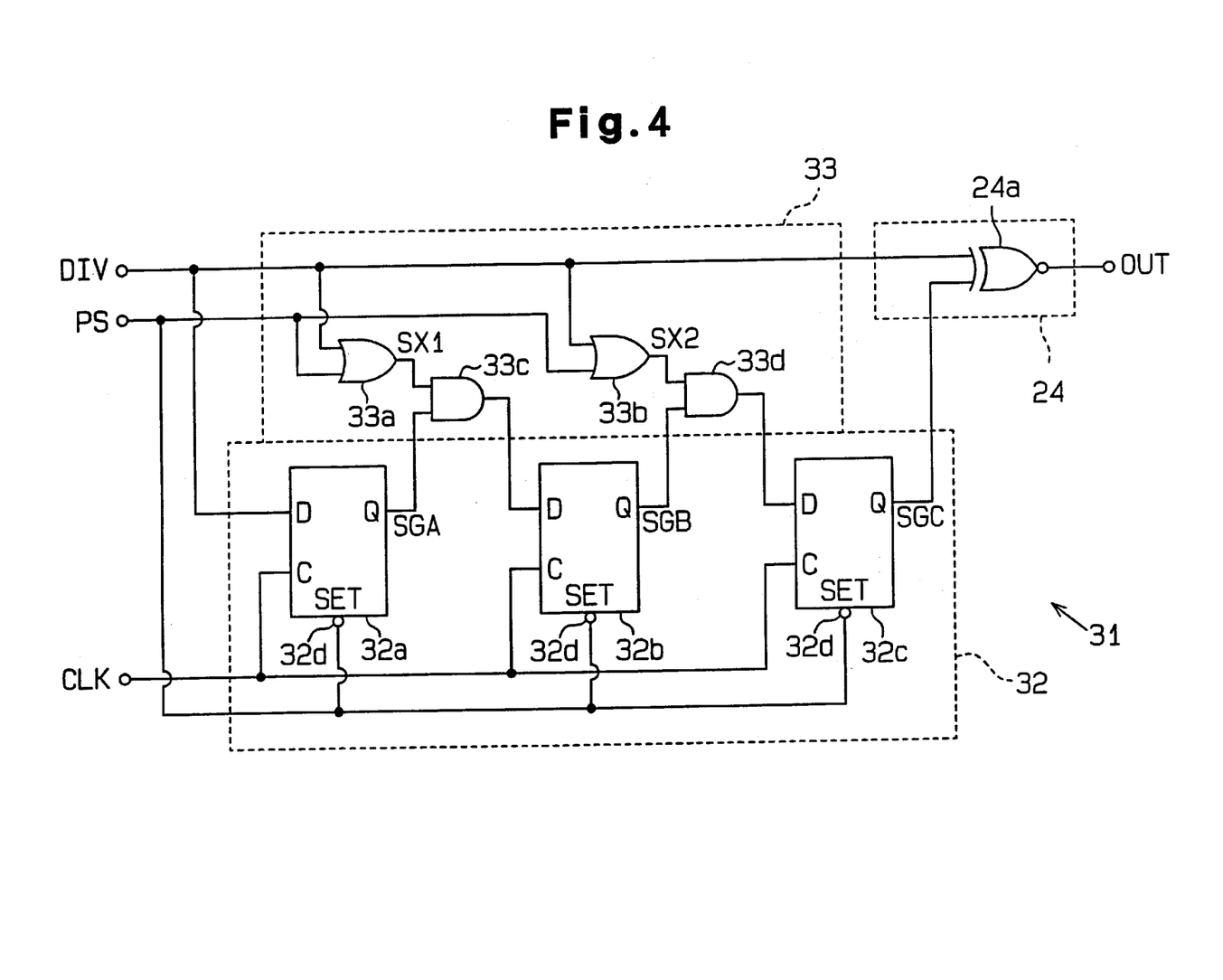
FIG. 4 is a block diagram showing a reset circuit according to a second embodiment of the present invention.

With reference to FIG. 4, a reset circuit 31 includes a delay circuit 32, which is provided with three D flip-flops (S-DFFs). The S-DFFs 32a–32c each have a set input terminal SET, which receives the power-save signal PS via an inverter circuit 32d, and an output terminal Q. When the power-save signal PS goes low, the S-DFFs 32a–32c are each set. Thus, the corresponding output signals SGA, SGB, SGC generated from the associated output terminals Q go high.

The S-DFFs 32a–32c further each have a clock input terminal C, which receives the delayed clock CLK (reference signal fr). In response to the delayed clock CLK (reference signal fr), the S-DFFs 32a–32c each hold the level of the signal received by the associated data input terminal D and output the signal, which level is held, from the output terminal Q as the corresponding output signal SGA, SGB, SGC.

A control circuit 33 has two OR circuits 33a, 33b and two AND circuits 33c, 33d. The OR circuits 33a, 33b each have two input terminals to receive the frequency setting signal DIV and the power-save signal PS.

The AND circuit 33c has two input terminals to receive an output signal SX1 from the OR circuit 33a and the output signal SGA from the first S-DFF 32a. The output terminal of the AND circuit 33c is connected to the data input terminal D of the second S-DFF 32b. Accordingly, when the output signal SX1 of the OR circuit 33a is high, the AND circuit 33c provides the output signal SGA of the first S-DFF 32a to the second S-DFF 32b.

The AND circuit 33d has two input terminals to receive an output signal SX2 from the OR circuit 33b and the output signal SGB from the second S-DFF 32b. The output terminal of the AND circuit 33d is connected to the data input terminal D of the third S-DFF 32c. Accordingly, when the output signal SX2 of the OR circuit 33b is high, the AND circuit 33d provides the output signal SGB of the second S-DFF 32b to the third S-DFF 32c.

The operation of the reset circuit 31 will now be described.

(1) Non-power-save Mode

In a non-power-save mode, the power-save signal PS is high. The AND circuits 33c, 33d of the control circuit 33 thus each provide the following S-DFF 32b, 32c with the output signals SGB, SGC, respectively.

Therefore, in the same manner as the first embodiment, whenever the level of the frequency setting signal DIV is shifted, the delay circuit 32 continues to output the frequency setting signal DIV (output signal SGC) having the level prior to the shifting until receiving three pulses of the delayed clock CLK.

The output signal SGC causes the output signal OUT, which is provided to the phase comparator 17 from the exclusive NOR circuit 24a, to go low.

(2) Entering Power-save Mode from Non-power Save Mode

The power-save signal PS changes from a high level to a low level when entering the power-save mode. When the power-save signal PS goes low, the S-DFFs 32a–32c are set and the output signals SGA, SGB, SGC go high.

Further, when the power-save signal PS goes low, the output signals SX1, SX2 of the respective OR circuits 33a,

33b go low when the frequency setting signal DIV is low. On the other hand, the output signals SX1, SX2 go high when the frequency setting signal DIV is high.

(a) Low Frequency Setting Signal DIV

When the frequency setting signal DIV is low, the frequency setting signal DIV received by the data input terminal D of the first S-DFF 32a is low, the output signal SX1 received by the data input terminal D of the second S-DFF 32b is low, and the output signal SX2 received by the data input terminal D of the third S-DFF 32c is low.

If the power-save signal PS goes high from this state to cancel the power-save mode, the output signals SGA, SGB, SGC of the respective S-DFFs 32a–32c each go low in response to the first pulse of the clock CLK. Therefore, the output signal SGC and the frequency setting signal DIV are both low, causing the output signal OUT of the exclusive NOR circuit 24a to go high. The high power-save signal PS and the high output signal OUT immediately activates the phase comparator 17.

If the frequency setting signal DIV goes high before the power-save signal PS goes high, the frequency setting signal DIV received by the data input terminal D of the first S-DFF 32a is high, the output signal SGA received by the data input terminal D of the second S-DFF 32b is high, and the output signal SGB received by the data input terminal D of the third S-DFF 32c is high.

If the power-save signal PS goes high from this state, the output signals SGA, SGB, SGC of the respective S-DFFs 32a–32c each go high in response to the first pulse of the clock CLK. Therefore, the output signal SGC and the frequency setting signal DIV both go high causing the output signal OUT of the exclusive NOR circuit 24a to go high. The high power-save signal PS and the high output signal OUT immediately activates the phase comparator 17.

(b) High Frequency Setting Signal DIV

When the frequency setting signal DIV is high, the frequency setting signal DIV received by the data input terminal D of the first S-DFF 32a is high, the output signal SX1 received by the data input terminal D of the second S-DFF 32b is high, and the output signal SX2 received by the data input terminal D of the third S-DFF 32c is high.

If the power-save signal PS goes high from this state, the output signals SGA, SGB, SGC of the respective S-DFFs 32a–32c each high in response to the first pulse of the clock CLK. Therefore, the output signal SGC and the frequency setting signal DIV are both high, causing the output signal OUT of the exclusive NOR circuit 24a to go high. The high power-save signal PS and the high output signal OUT immediately activates the phase comparator 17.

If the frequency setting signal DIV goes low before the power-save signal PS goes high, the frequency setting signal DIV received by the data input terminal D of the first S-DFF 32a is low, the output signal SX1 received by the data input terminal D of the second S-DFF 32b is low, and the output signal SX2 received by the data input terminal D of the third S-DFF 32c is low.

If the power-save signal PS goes high from this state, the output signals SGA, SGB, SGC of the respective S-DFFs 32a–32c each go low in response to the first pulse of the clock CLK. Therefore, the output signal SGC and the frequency setting signal DIV both go high causing the output signal OUT of the exclusive NOR circuit 24a to go high. The high power-save signal PS and the high output signal OUT immediately activates the phase comparator 17.

When the power-save signal PS goes high to cancel the power-save mode, the output signals SX1, SX2 of the control circuit 33 cause the level of the output signal SGC generated by the delay circuit 32 to match the level of the current frequency setting signal DIV. Accordingly, when the power-save mode is cancelled, the phase comparator 17 immediately compares the reference signal fr with the comparison signal fp without stopping the comparison process for a predetermined time determined by the reset circuit 31. Thus, in a PLL frequency synthesizer including the reset circuit 31 of the second embodiment, the lock-up process is performed without being delayed by the reset circuit 31 after the power-save mode is cancelled regardless of whether the frequency setting signal DIV is shifted or not during the power-save mode.

A third embodiment according to the present invention will now be described with reference to FIG. 5. Description will be centered on a reset circuit 41, which includes the novel features of the third embodiment.

Figure 5:
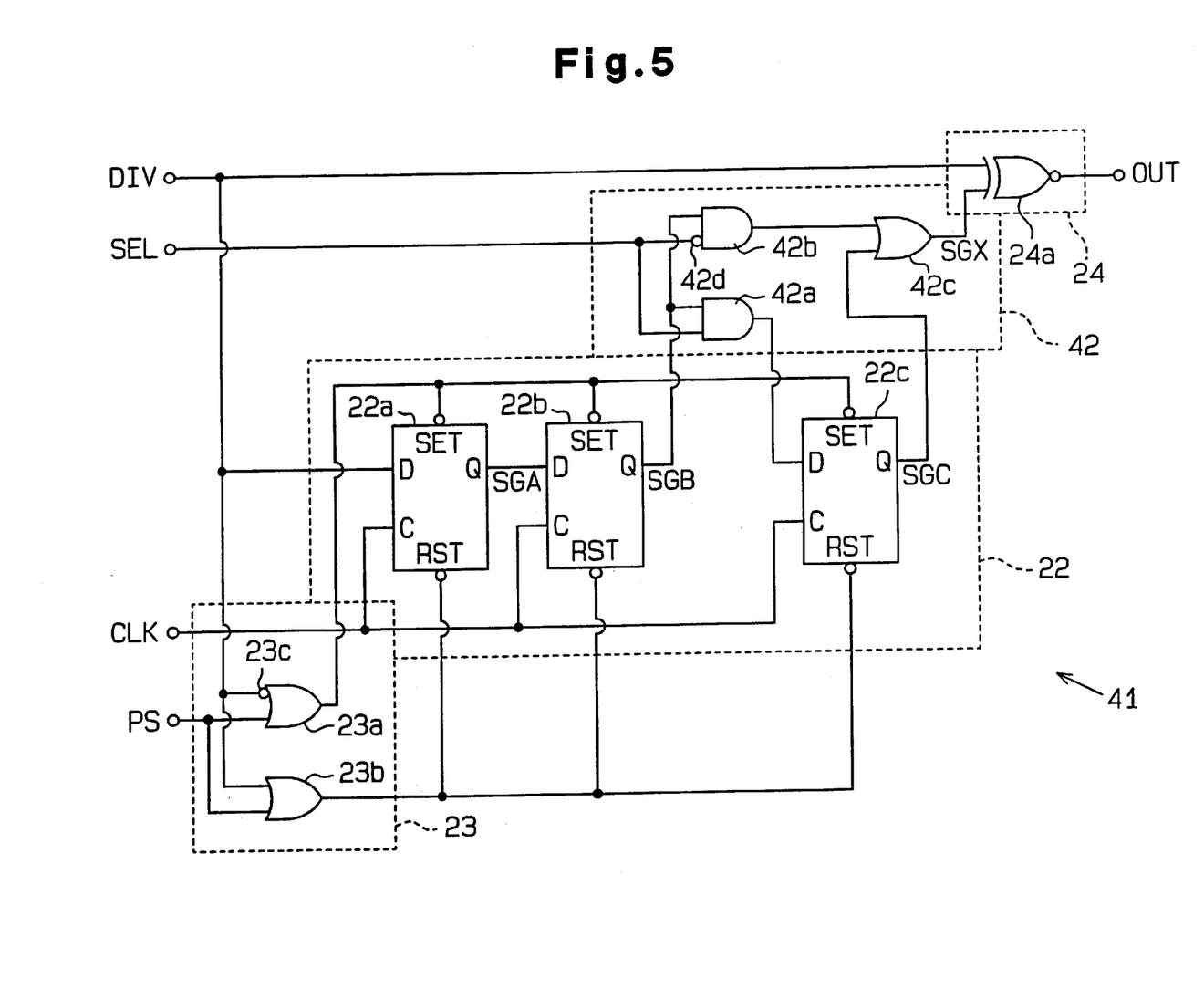
FIG. 5 is a block diagram showing a reset circuit according to a third embodiment of the present invention.

With reference to FIG. 5, the reset circuit 41 includes a time adjustment circuit 42 in addition to the delay circuit 22, the control circuit 23, and the determination circuit 24. Based on a selection signal SEL, the time adjustment circuit 42 determines whether to provide the determination circuit 24 with the output signal SGB, which is generated by the second SR-DFF 22b of the delay circuit 22, i.e., the output signal SGC, which is generated by the third SR-DFF 22c. When the output signal fvco of the PLL frequency synthesizer 10 is altered, the selection signal SEL, which is provided by an external device, is used to select an optimal VCO from among a plurality of VCOs (two in this embodiment) for generating the output signal fvco with the altered frequency. A first VCO, which requires a long period of time until it stabilizes when activated, is selected when the selection signal SEL is high. A second VCO, which stabilizes within a short period of time when activated, is selected when the selection signal SEL is low.

The time adjustment circuit 42 has two AND circuits 42a, 42b, an OR circuit 42c, and an inverter circuit 42d. The AND circuit 42a has two input terminals to receive the selection signal SEL and the output signal SGB of the second SR-DFF 22b. The output terminal of the AND circuit 42a is connected to the data input terminal D of the third SR-DFF 22c. Accordingly, when the selection signal SEL is high, the AND circuit 42a provides the output signal SGB of the second SR-DFF 22b to the third SR-DFF 22c. On the other hand, when the selection signal SEL is low, the AND circuit 42a provides a low signal (selection signal SEL) to the third SR-DFF 22c regardless of the level of the output signal SGB.

The AND circuit 42b has two input terminals to receive the selection signal SEL via the inverter circuit 42d and the output signal SGB of the second SR-DFF 22b. The output terminal of the AND circuit 42b is connected to the data input terminal D of the following OR circuit 42c. Accordingly, when the selection signal SEL is low, the AND circuit 42b provides the output signal SGB of the second SR-DFF 22b to the OR circuit 42c. On the other hand, when the selection signal SEL is high, the AND circuit 42b provides a low signal to the OR circuit 42c regardless of the level of the output signal SGB.

The OR circuit 42c has two input terminals, one connected to the output terminal of the AND circuit 42b and the other connected to the output terminal Q of the third SR-DFF 22c. Accordingly, the OR circuit 42c outputs the output signal SGB of the second SR-DFF 22b as an output signal SGX when the selection signal SEL is low, and the output signal SGC of the third SR-DFF 22c as the output signal SGX when the selection signal SEL is high.

The exclusive NOR circuit 24a of the determination circuit 24 receives the output signal SGX of the OR circuit 42c and the frequency setting signal DIV and generates an output signal OUT in accordance with whether the levels of the signals SGX, DIV match.

In other words, when the first VCO, which requires a long period of time until it stabilizes when activated, is selected, the selection signal SEL is high. Therefore, the OR circuit 42c provides the exclusive NOR circuit 24a with the output signal SGC of the third SR-DFF 22c as the output signal SGX. As a result, if the level of the frequency setting signal DIV is shifted when the power-save mode is cancelled, the output signal OUT goes high after the third pulse of the clock CLK.

On the other hand, when the second VCO, which stabilizes within a short period of time when activated, is selected, the selection signal SEL is low. Therefore, the OR circuit 42c provides the exclusive NOR circuit 24a with the output signal SGB of the second SR-DFF 22b as the output signal SGX. As a result, if the level of the frequency setting signal DIV is shifted when the power-save mode is cancelled, the output signal OUT goes high after receiving the second pulse of the clock CLK.

In other words, the output signal OUT generated by the reset circuit 41 shortens the deactivated time of the phase comparator 17 when the second VCO is selected and lengthens the deactivated time of the phase comparator 17 when the first VCO is selected.

The operation of the reset circuit 41 relative to the power-save signal PS is the same as the first embodiment and thus will not be described.

The third embodiment has the same advantages as the first embodiment. Additionally, the reset circuit 41 of the third embodiment is provided with the time adjustment circuit 42 to control the deactivated time of the phase comparator 17 in accordance with the selected VCO. Accordingly, the PLL frequency synthesizer further decreases the lock-up time subsequent to cancellation of the power-save mode regardless of whether or not the frequency setting signal DIV is shifted during the power-save mode.

It should be apparent to those skilled in the art that the present invention may be embodied in many other specific forms without departing from the spirit or scope of the invention. Particularly, it should be understood that the present invention may be embodied in the following forms.

In the second embodiment, the control circuit 33 is provided with the two OR circuits 33a, 33b. However, for example, the OR circuit 33b may be deleted and the output signal SX1 of the OR circuit 33a may be provided to the AND circuit 33d instead. This allows the circuit scale to be further reduced.

In each of the above embodiments, the reset circuit 21, 31, 41 uses the reference signal fr as the delayed clock CLK. However, the comparison signal fp, the divided signal fpp, i.e., the comparison oscillation signal fin may be used as the delayed clock CLK instead.

In each of the above embodiments, the determination circuit 24 comprises the exclusive NOR circuit 24a. However, an exclusive OR circuit may be used instead. In this case, the phase comparator 17 generates a high output signal OUT, which functions as a reset signal, to deactivate the phase comparator 17.

In each of the above embodiments, the delay circuits 22, 32 are shift registers formed by D flip-flops. However, the delay circuits 22, 32 may, for example, employ capacitance devices or inverter circuits connected in series.

In each of the above embodiments, the delay circuits 22, 32 are formed by three D flip-flops. However, the number of flip-flops is not limited to three.

In each of the above embodiments, the present invention is applied to the reset circuit of a PLL frequency synthesizer. However, the present invention may be applied to the reset circuit of electronic devices other than PLL frequency synthesizers.

The present examples and embodiments are to be considered as illustrative and not restrictive, and the invention is not to be limited to the details given herein, but may be modified within the scope and equivalence of the appended claims.

What is claimed is:

1. A reset circuit comprising:

a delay circuit for receiving a shift signal and generating an output signal by delaying the shift signal for a predetermined time;

a determination circuit for receiving the shift signal and the output signal, determining whether the level of the shift signal matches the level of the output signal, and generating a non-matching signal for the predetermined time when the level of the shift signal is being shifted, the non-matching signal being provided as a reset signal to a phase comparator for the predetermined time; and a control circuit for receiving a power-save signal, which deactivates the phase comparator, wherein the control circuit provides the delay circuit with a control signal for matching the level of the output signal with the level of the shift signal when the level of the shift signal is changed during the term of the power save signal.

2. A reset circuit for a PLL frequency synthesizer, the synthesizer including a phase comparator that stops comparing the phase of a reference signal with the phase of a comparison signal for a predetermined time whenever the level of a frequency setting signal is shifted, the reset circuit comprising:

a delay circuit for receiving the frequency setting signal and generating an output signal by delaying the frequency setting signal for the predetermined time;

a determination circuit for receiving the frequency setting signal and the output signal, determining whether the level of the frequency setting signal matches the level of the output signal, and generating a reset signal for the predetermined time when the level of the frequency setting signal is shifted, wherein the reset signal is provided to the phase comparator for the predetermined time; and a control circuit for receiving a power-save signal and deactivating the phase comparator in response thereto, wherein the control circuit provides the delay circuit with a control signal for matching the level of the output signal with the level of the frequency setting signal when the level of the frequency setting signal is changed during the term of the power save signal.

3. The reset circuit according to claim 2, wherein the delay circuit is a shift register including a plurality of series-connected D flip-flops, each having a set terminal and a reset terminal, and wherein the control circuit is a set/reset signal generating circuit that sets or resets each of the D flip-flops based on the level of the current frequency setting signal when the level of the frequency setting signal is changed during the term of the power save signal.

4. The reset circuit according to claim 2, wherein the delay circuit is a shift register including a plurality of series-connected D flip-flops, each having a set terminal, and wherein the control circuit is a signal generating circuit for setting each of the D flip-flops when the power-save signal is received and providing a data input terminal of each of the D flip-flops except for a first one of the D flip-flops with a signal having a level that matches the level of the current frequency setting signal when the level of the frequency setting signal is changed during the term of the power save signal.

5. A reset circuit for a PLL frequency synthesizer, the synthesizer including a phase comparator that stops comparing the phase of a reference signal with the phase of a comparison signal for a predetermined time whenever the level of a frequency setting signal is shifted, the reset circuit comprising:

a delay circuit for receiving the frequency setting signal and generating a plurality of output signals, each having a different delay time, based on the frequency setting signal;

a time adjustment circuit for selecting and outputting one of the plurality of output signals;

a determination circuit for receiving the frequency setting signal and the output signal selected by the time adjustment circuit, determining whether the level of the frequency setting signal matches the level of the selected output signal, and generating a reset signal for the predetermined time when the level of the frequency setting signal is shifted, the reset signal being provided to the phase comparator for the predetermined time; and a control circuit for receiving a power-save signal, which deactivates the phase comparator, wherein the control circuit provides the delay circuit with a control signal for matching the level of the selected output signal with the level of the frequency setting signal when the level of the frequency setting signal is changed during the term of the power-save signal.

6. The reset circuit according to claim 5, wherein the delay circuit is a shift register including a plurality of series-connected D flip-flops, each having a set terminal and a reset terminal, and wherein the control circuit is a set/reset signal generating circuit that sets or resets each of the D flip-flops based on the level of the frequency setting signal when the level of the frequency setting signal is changed during the term of the power-save signal.

7. The reset circuit according to claim 5, wherein the delay circuit is a shift register including a plurality of series-connected D flip-flops, each having a set terminal, and wherein the control circuit is a signal generating circuit for setting each of the D flip-flops when the power-save signal is received and providing a data input terminal of each of the D flip-flops with a signal having a level that matches the level of the frequency setting signal when the level of the frequency setting signal is changed during the term of the power-save signal.

8. A reset circuit, comprising:

a delay circuit for receiving a shift signal and generating an output signal by delaying the shift signal for a predetermined time;

a determination circuit for receiving the shift signal and the output signal, and for generating a reset signal of a phase comparator during the time when there is a level difference between the shift signal and the output signal; and a control circuit for receiving a power-save signal, which deactivates the phase comparator, and for preventing the delay circuit from delaying the shift signal and from making the level difference between the shift signal and the output signal when the level of the shift signal is changed during the term of the power-save signal.

* * * * *